United States Patent [19]

Asghar et al.

[11] Patent Number: 5,189,381

[45] Date of Patent: Feb. 23, 1993

[54] APPARATUS FOR GENERATING A SINUSOIDAL OUTPUT SIGNAL

[75] Inventors: Safdar M. Asghar; Alfredo R. Linz, both of Austin, Tex.

[73] Assignee: Advanced Micro Devices, Inc., Sunnyvale, Calif.

[21] Appl. No.: 785,497

[22] Filed: Oct. 31, 1991

[51] Int. Cl.$^5$ .............................................. H03B 1/00
[52] U.S. Cl. ...................................... 331/179; 332/100
[58] Field of Search ................ 331/179; 332/100, 101, 332/102; 375/45, 62, 65

[56] References Cited

U.S. PATENT DOCUMENTS 4,573,025  2/1986  McKinzie, III ...................... 332/102

Primary Examiner—Robert J. Pascal
Attorney, Agent, or Firm—Foley & Lardner

[57] ABSTRACT

An apparatus is disclosed for generating an output signal in response to an input signal having a variable input level. The output signal has an output frequency which varies to represent variations in the input level. The apparatus comprises a processing circuit for implementing a digital signal processing algorithm to generate control signals in response to the input signal, which control signals are representative of the variable input level, and an oscillator circuit for generating the output signal in response to the control signals. The control signals include a first control signal representing a first output frequency, a second control signal representing a second output frequency, and at least one intermediate control signal representing output frequencies intermediate the first and second output frequencies. The processing circuit generates at least one intermediate control signal whenever the output signal varies between the first and the second output frequencies which serves to "soften" the transition between the first and second output frequencies and reduces noise which usually is generated by such sudden changes in output frequency.

9 Claims, 3 Drawing Sheets 5,189,381

APPARATUS FOR GENERATING A SINUSOIDAL OUTPUT SIGNAL

BACKGROUND OF THE INVENTION

Generation of sinusoidal output signals having a variable output frequency responsive to an input signal having a variable input level is a well-known method of effecting digital communications. Common applications of such a communications technique are frequency shift keying (FSK), and derivatives of FSK such as minimum shift keying (MSK) and Gaussian minimum shift keying (GMSK).

Generation of such FSK signals is sometimes effected by circuitry involving analog devices, and such analog devices are generally bulkier and less stable (especially in temperature-varying environments) than digital devices.

In apparatuses generating FSK signals employing digital devices, sudden frequency shifts in response to changes in signal levels of input signals generally involve undesirable noise during frequency transitions.

It is desirable that stable, generally compact digital devices be employed in digital communications effecting FSK operations without generating disruptive noise during frequency transitions.

SUMMARY OF THE INVENTION

The invention is an apparatus for generating an output signal in response to an input signal having a variable input level. The output signal has an output frequency which varies to represent variations in the input level. The apparatus comprises a processing circuit for implementing a digital signal processing algorithm to generate a plurality of control signals in response to the input signal, which plurality of control signals is representative of the variable input level, and an oscillator circuit for generating the output signal in response to the plurality of control signals. The plurality of control signals includes a first control signal representing a first output frequency of the output signal, a second control signal representing a second output frequency of the output signal, and at least one intermediate control signal representing output frequencies of the output signal intermediate the first output frequency and the second output frequency. Preferably, each respective intermediate control signal is associated with a respective intermediate frequency.

The processing circuit generates at least one of the intermediate control signals whenever the output signal varies from the first output frequency to the second output frequency or whenever the output signal varies from the second output frequency to the first output frequency. Such intermediate frequency generation on every occasion of frequency shift by the oscillator circuit serves to "soften" the transition between the first and second output frequencies and reduces noise which usually is generated by such sudden changes in output frequency.

Preferably, the oscillator circuit comprises a first delay circuit which receives a first signal and generates a second signal, which second signal is delayed one clock period with respect to the first signal; and a second delay circuit which receives the second signal from the first delay circuit and generates a third signal, which third signal is delayed one clock period with respect to the second signal. Further included in the oscillator circuit is a multiplying circuit for multiplying a signal by a multiplier. The multiplying circuit receives the second signal from the first delay circuit, receives a multiplier at a multiplier input, and generates a multiplier output signal which comprises the second signal multiplied by the multiplier. The oscillator circuit further includes a differential circuit which receives the third signal from the second delay circuit and receives the multiplier output signal from the multiplying circuit, and generates a sinusoidal output which is the difference between the multiplier output signal less the third signal; the sinusoidal output signal is also provided in a feedback loop to the first delay circuit and is received by the first delay circuit as the first signal so that the oscillator circuit operates as a recursive oscillator.

In the preferred embodiment, the multiplier received by the multiplier circuit comprises a constant which is representative of the varying input level of the input signal. The multiplier thus is employed as a control signal and may be generated by a control signal generator. Such a control signal generator may, in its preferred embodiment, include a scaling circuit for receiving the input signal and scaling the input signal according to at least one scaling factor to produce the control signal (i.e., the multiplier). In an alternate embodiment, such a control signal generator may comprise a logic circuit receiving the input signal and an array of digital filters. The logic circuit selects one digital filter of the array of digital filters in response to the input signal level. The selected digital filter receives the input signal from the logic circuit and filters the input signal to produce a selected control signal appropriate to cause the oscillator circuit to generate its sinusoidal output at the correct frequency to represent the respective input signal level at hand. Digital filters are provided for producing appropriate control signals to yield intermediate output frequencies to reduce noise during output signal frequency excursions.

It is, therefore, an object of the present invention to provide an apparatus for generating a sinusoidal output signal in response to an input signal having a variable input level which employs digital signal processing technology to effect such generation.

It is another object of the present invention to provide an apparatus for generating a sinusoidal output signal in response to an input signal having a variable input level which employs digital signal processing technology to effect such generation without generating disruptive noise during frequency transitions.

Further objects and features of the present invention will be apparent from the following specification and claims when considered in connection with the accompanying drawings illustrating the preferred embodiment of the invention.

DETAILED DESCRIPTION OF THE DRAWINGS

DETAILED DESCRIPTION OF THE INVENTION

Figure 1:
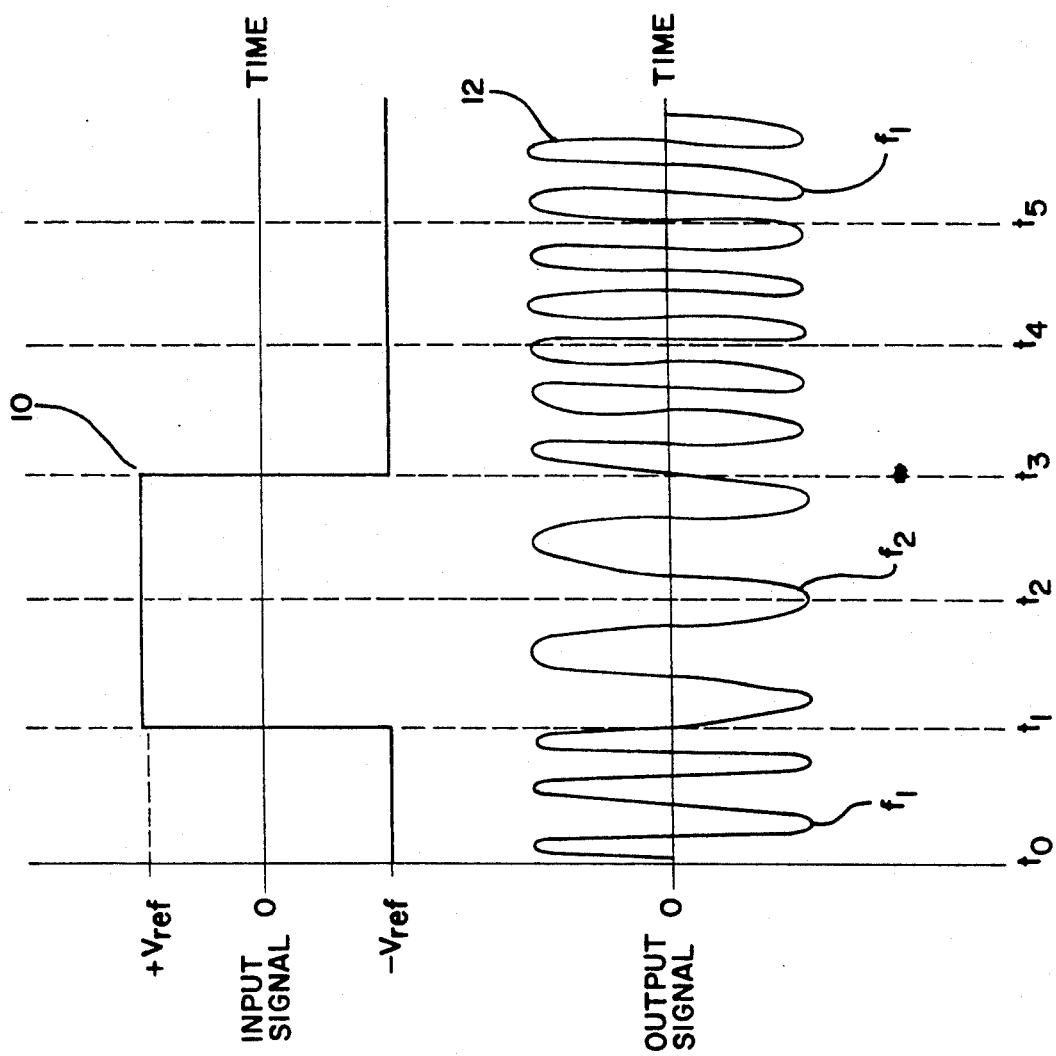
FIG. 1 illustrates the relationship between an output signal and an input signal as contemplated by the operation of the present invention.

A typical frequency modulation scheme encountered in digital communications, and commonly encountered in frequency shift keyed (FSK) communication systems, is illustrated in FIG. 1. In FIG. 1, a digital input signal is illustrated varying over time between $-V_{ref}$ and $+V_{ref}$ so that input signal 10 is at a level $-V_{ref}$ from time $t_0$ to time $t_1$; shifts to a level $+V_{ref}$ at time $t_1$, maintaining the level $+V_{ref}$ until time $t_3$; and shifts to level $-V_{ref}$ at time $t_3$, maintaining level $-V_{ref}$ from time $t_3$ through time $t_5$.

Output signal 12 is modulated according to the level of input signal 10. Thus, output signal 12 has a frequency $f_1$ between time $t_0$ and time $t_1$ when input signal 10 is at value $-V_{ref}$, output signal 12 has a frequency $f_2$ during the interval between time $t_1$ and time $t_3$ when input signal 10 has value $+V_{ref}$, and output signal 12 is transmitted at frequency $f_1$ during the time interval $t_3$ through $t_5$ when input signal 10 again has value $-V_{ref}$. In such manner, the frequency of output signal 12 represents the signal level of input signal 10.

The apparatus of the present invention is based upon the following trigonometric relations: A frequency function may be defined as:

$$\omega(f, f_s) = 2\pi \frac{f}{f_s};$$

where $f_s$ is a sampling rate and $f$ is a desired frequency.

If the expression $x(n) = A \sin(n\omega)$ represents a sinusoidal wave output of the apparatus, then the following delayed sequences of that sinusoidal output signal can be defined: Current t-time output:

$$x(n) = A\sin(n\omega) \qquad [1]$$

Output, one time interval later:

$$x(n-1) = A\sin(n\omega - \omega)$$

$$x(n-1) = A\sin(n\omega)\cos(\omega) - A\cos(n\omega)\sin(\omega) \qquad [2]$$

Output, two time intervals later:

$$x(n-2) = A\sin(n\omega - 2\omega)$$

$$x(n-2) = A\sin(n\omega)\cos(2\omega) - A\cos(n\omega)\sin(2\omega) \qquad [3]$$

Multiplying Eq. [2] by $2\cos(\omega)$ yields:

$$[2\cos(\omega)][x(n-1)] = [A\sin(n\omega)\cos(\omega)][2\cos(\omega)] - [A\cos(n\omega)\sin(\omega)][2\cos(\omega)]$$

Using the trigonometric identity $\sin(2\omega) = 2\sin(\omega)\cos(\omega)$ yields:

$$[2\cos(\omega)][x(n-1)] = [2A\sin(n\omega)\cos^2(\omega)] - [A\cos(n\omega)\sin(2\omega)]$$

Subtracting Eq. [3] from Eq. [2] yields:

$$[2\cos(\omega)][x(n-1)] - x(n-2) = 2A\sin(n\omega)\cos^2(\omega) - A\cos(n\omega)\sin(2\omega)] - A\sin(n\omega)\cos(2\omega) + A\cos(n\omega)\sin(2\omega)$$

Reducing the above expression yields:

$$2\cos(\omega)x(n-1) - x(n-2) = A\sin(n\omega)[2\cos^2(\omega)] - \cos(2\omega)]$$

Recalling that $x(n) = A\sin(n\omega)$, the expression may be rewritten:

$$2\cos(\omega)x(n-1) - x(n-2) = x(n)[2\cos^2(\omega) - \cos(2\omega)]$$

Using the trigonometric identity $$\cos^2(\omega) = \frac{1 + \cos(2\omega)}{2}$$

yields:

$$2\cos(\omega)x(n-1) - x(n-2) = x(n)$$

This expression may be written in the form:

$$x(n) = \delta x(n-1) - x(n-2)$$

where $\delta = 2\cos(\omega)$, and $\delta$ is a constant for a given frequency, $\omega$.

Thus, the current output $x(n)$ is recursively related to outputs one time interval later $(x(n-1))$ and two time intervals later $(x(n-2))$, and the recursive nature of output signal $x(n)$ can be used to generate sine waves using a sampling frequency $f_s$ that has no specific relationship to the desired frequency $(f)$ to be generated, except that the sampling frequency must satisfy Nyquist's sampling theorem (i.e., $f_s \geq 2f$).

This recursive relationship facilitates simplified sinusoidal output signal generation. Distinct advantages are especially provided in the implementation of such recursive signal generation since prior art apparatuses employing look-up tables (read-only memories; ROM) to store wave-form samples, with the number of samples required to be stored being dependent upon the relationship between the desired frequency and the sampling rate. In contrast, the recursive capability of the present invention requires only two storage locations, regardless of what frequency is desired. Specifically, the recursive capability of the present invention facilitates generation of a sinusoidal output signal using two successive signal samples $[x(n-1)$, and $x(n-2)]$. Thus, two storage locations are all that are required for employing the recursive relationship: one storage location for $x(n-1)$ and one storage location for $x(n-2)$.

Figure 2:
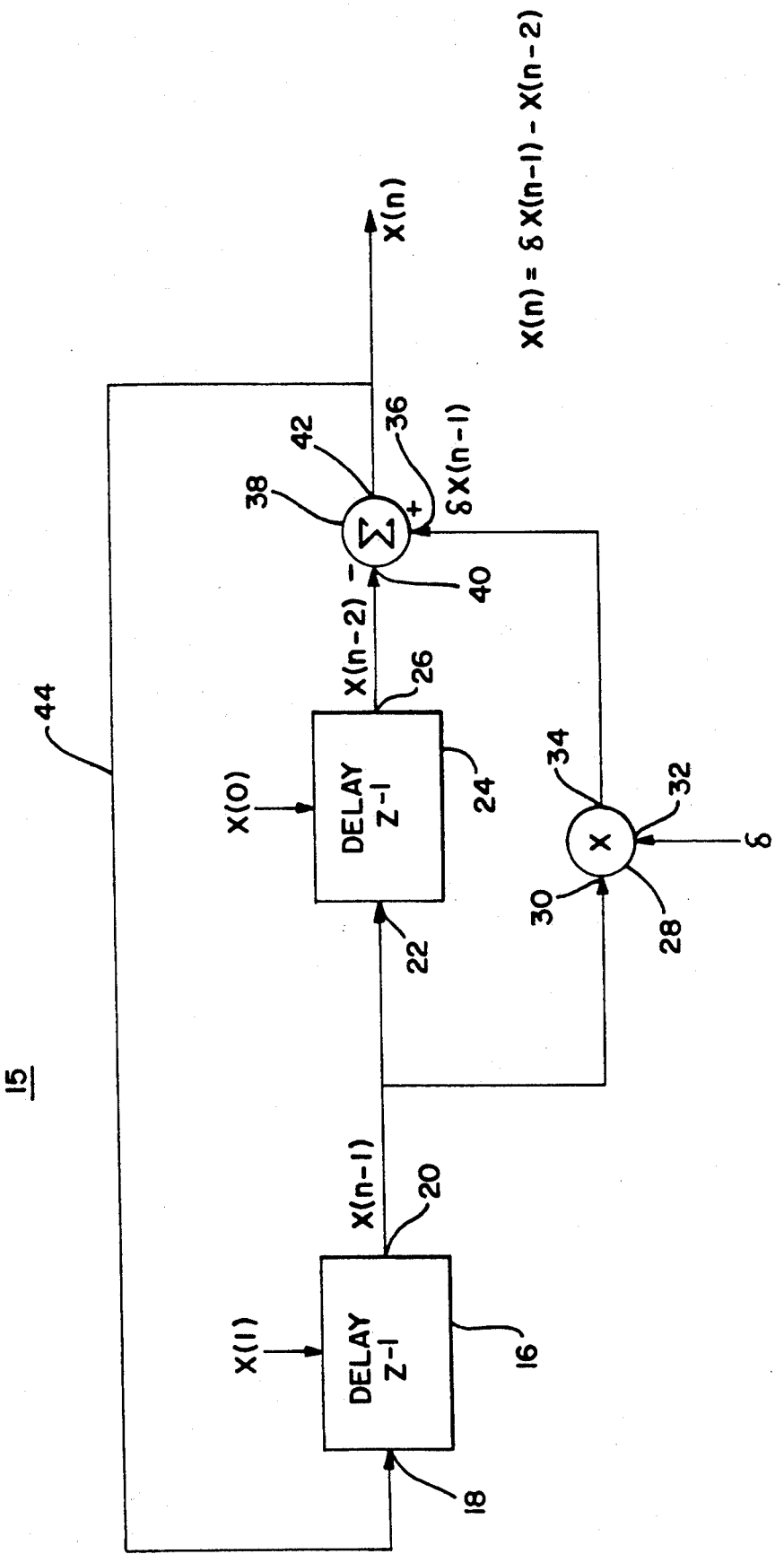
FIG. 2 illustrates the preferred embodiment of an oscillator circuit employed in the present invention.

FIG. 2 is an illustration of the preferred embodiment of a recursive oscillating circuit apparatus employing the above-described relationships to advantage. In FIG. 2, a first delay circuit 16 receives a first signal at an input 18 and generates a once-delayed output signal at an output 20. The once-delayed output signal is delayed one time period from the first signal received at input 18. The once-delayed output signal from output 20 of first delay circuit 16 is received as an input signal by a second delay circuit 24 at an input 22. Second delay circuit 24 produces a twice-delayed output signal at its output 26, which twice-delayed output signal is delayed one clock period from the once-delayed output signal received at its input 22.

The once-delayed output signal from first delay circuit 16 is also provided as an input to a multiplier circuit 28 at an input 30. Multiplier circuit 28 multiplies the once-delayed output signal received from first delay circuit 16 by a multiplier $\delta$ received at a multiplier input 32, and provides a multiplier output signal at its output 34. The multiplier output signal is provided to a positive node 36 of a summing unit 38. Summing unit 38 also receives at its negative node 40 the twice-delayed output signal from output 26 of second delay circuit 24. Thus, summing unit 38 provides at its output 42 a difference signal representing the difference between the multiplier output signal received at its input node 36, less the twice-delayed output signal received at its negative node 40. This difference signal is the sinusoidal output signal x(n).

Sinusoidal output signal x(n) is provided through a feedback line 44 to first delay circuit 16 and comprises the first signal received by first delay circuit 16 at its input 18. Thus, there is provided a recursive oscillator circuit 15 which provides an output x(n) determined by a multiplier δ received at multiplier input 32. Initial conditions are established for oscillator circuit 15 by an input x(1) to first delay circuit 16 and by an input x(0) to second delay circuit 24. Preferably, x(1)=Asinω₀ and x(0)=0, where A signifies amplitude of the signal x(1) and ω₀ signifies an initial frequency $$\left(\omega_0 = \frac{2\pi f_0}{f_s}\right).$$

Figure 3:
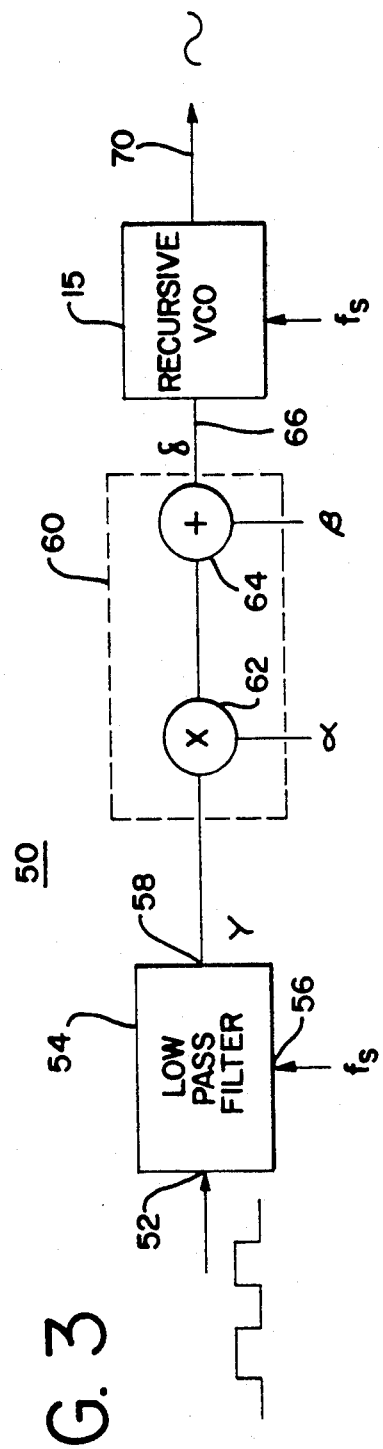
FIG. 3 illustrates the preferred embodiment of the present invention.

The employment of recursive oscillator circuit 15 as illustrated in FIG. 2 in a communications system is illustrated, in its preferred embodiment, in FIG. 3. In FIG. 3, a communications system 50 is illustrated receiving a digital signal input at an input 52 to a low pass filter (or signal synthesizer) 54. Low pass filter 54 employs a sampling frequency $f_s$ received at an input 56. A signal "y" is generated from low pass filter 54 at an output 58 and passed to a scaling circuit 60. Scaling circuit 60 comprises a multiplier unit 62 and an adder unit 64 to which output signal "y" is successively applied. Scaling circuit 60 applies scaling factors α and β to signal y to produce an output δ on line 66 such that δ=αy+β. The scaled output δ is applied to recursive oscillator 15 and recursive oscillator 15 generates an output signal at line 70 in a manner as described in connection with FIG. 2. Thus, the output signal at line 70 is a sinusoidal output signal which is defined by control signal δ which is received by recursive oscillator 15 via line 66 from scaling circuit 60.

Figure 4:
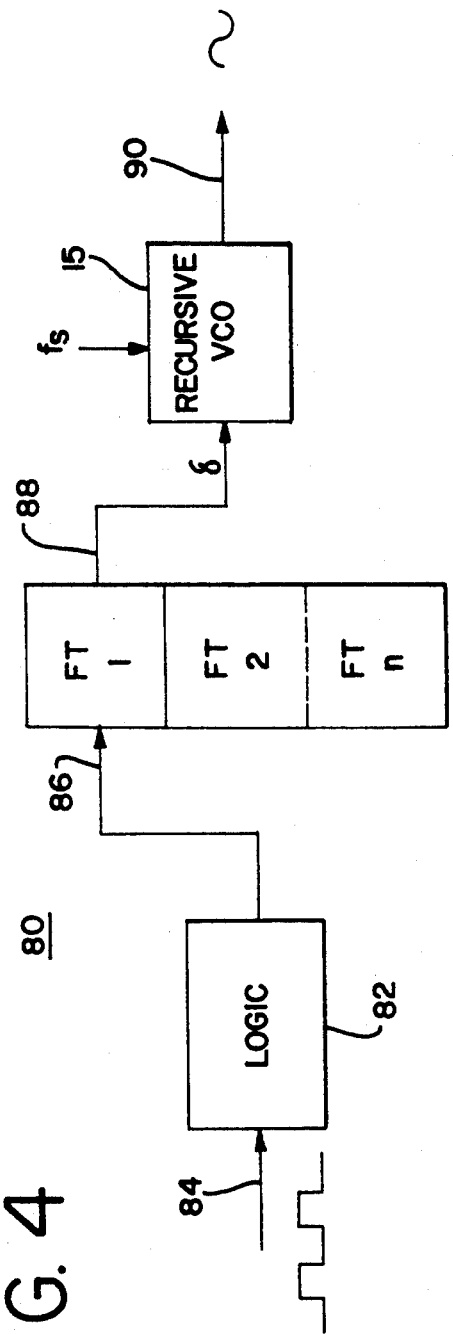
FIG. 4 illustrates an alternate embodiment of the present invention.

An alternate embodiment of a communications system employing a recursive oscillator 15 of the type illustrated in FIG. 2 is illustrated in FIG. 4. In FIG. 4, a communications system 80 is illustrated comprising a logic circuit 82 which receives a digital input signal at an input 84. Depending upon the signal level of the input signal received at input 84, logic circuit 82 selects an appropriate filter among an array of filters FT1, FT2, ..., FTn for receiving a representation of the input signal on line 86. The selected appropriate filter, for example filter FT1 in FIG. 4, filters the representative input signal received on line 86 to produce a control signal δ on a line 88 for provision to a recursive oscillator 15. Selection of the appropriate filter FT1, FT2, ..., FTn by logic circuit 82 is preprogrammed in logic circuit 82 for effecting generation of a control signal δ to facilitate effecting noise-free transition of the frequency of an output signal produced at output 90 to accurately reflect deviations in the signal level of the input signal received at input 84 of logic circuit 82.

It is to be understood that, while the detailed drawings and specific examples given describe preferred embodiments of the invention, they are for the purpose of illustration only, that the apparatus of the invention is not limited to the precise details and conditions disclosed and that various changes may be made therein without departing from the spirit of the invention which is defined by the following claims:

I claim:

1. An apparatus for generating an output signal in response to an input signal having a variable input level, said output signal having an output frequency, variations in said output frequency being representative of variations in said input level; the apparatus comprising:
   a processing means for implementing a digital signal processing algorithm for generating a plurality of control signals in response to said input signal, said plurality of control signals being representative of said variable input level; and
   an oscillator means for recursively generating said output signal in response to said plurality of control signals; said output signal being successively sampled during a plurality of sampling intervals, said output signal during a respective sampling interval of said plurality of sampling intervals being algorithmically related to at least one earlier said sample of said output signal and to at least one said control signal of said plurality of control signals;
   said plurality of control signals including a first control signal, a second control signal, and at least one intermediate control signal, said oscillator means responding to said first control signal to generate said output signal at a first frequency, said oscillator means responding to said second control signal to generate said output signal at a second frequency, said oscillator means responding to said at least one intermediate control signal to generate said output signal at at least one intermediate frequency intermediate said first frequency and said second frequency, each respective intermediate control signal of said at least one intermediate control signal being associated with a respective intermediate frequency.

2. An apparatus for generating an output signal in response to an input signal having a variable input level as recited in claim 1 wherein said processing means generates at least one of said at least one intermediate control signal when said output signal varies from said first frequency to said second frequency or when said output signal varies from said second frequency to said first frequency.

3. An apparatus for generating a sinusoidal output signal as recited in claim 1 wherein each of said at least one control signal comprises a constant.

4. An apparatus for generating a sinusoidal output signal representative of an input signal, said output signal having an output frequency, said output frequency being a first frequency when said input signal is at a first level and said output frequency being a second frequency when said input signal is at a second level, the apparatus comprising:
   a controlled oscillator means for generating said sinusoidal output signal, said controlled oscillator means being responsive to a control signal to establish said output frequency; said output signal being successively sampled during a plurality of sampling intervals, said output signal during a respective sampling interval of said plurality of sampling intervals being algorithmically related to at least one earlier said sample of said signal and to said control signal; and a control signal generator, said control signal generator receiving said input signal and generating a plurality of said control signals in response to said input signal;

said plurality of control signals including a first control signal, a second control signal, and at least one intermediate control signal, said control signal generator generating said first control signal when said input signal is at a first frequency, said control signal generator generating said second control signal when said input signal is at a second frequency, said control signal generator generating at least one intermediate control signal to establish said output signal at at least one intermediate frequency intermediate said first frequency and said second frequency, each respective intermediate control signal of said at least one intermediate control signal being associated with a respective intermediate frequency.

5. An apparatus for generating a sinusoidal output signal representative of an input signal as recited in claim 4 wherein said control signal generator generates at least one of said at least one intermediate control signal when said output signal varies from said first frequency to said second frequency or when said output signal varies from said second frequency to said first frequency.

6. An apparatus for generating a sinusoidal output signal representative of an input signal as recited in claim 5 wherein said control signal generator includes a scaling means for scaling signals, said scaling means receiving said input signal and scaling said input signal according to at least one scaling factor to produce said plurality of control signals.

7. An apparatus for generating a sinusoidal output signal representative of an input signal as recited in claim 5 wherein said control signal generator includes a logic circuit and an array of digital filters, said logic circuit receiving said input signal and selecting one digital filter of said array of digital filters in response to said input signal as a receiving digital filter, said receiving digital filter receiving said input signal from said logic circuit and filtering said input signal to produce a selected control signal of said plurality of control signals.

8. An apparatus for generating an output signal in response to an input signal having a variable input level, said output signal having an output frequency, variations in said output frequency being representative of variations in said input level; the apparatus comprising:

a processing means for implementing a digital signal processing algorithm for generating a plurality of control signals in response to said input signal, said plurality of control signals being representative of said variable input level; and an oscillator means for recursively generating said output signal in response to said plurality of control signals; said output signal being successively sampled during a plurality of sampling intervals, said output signal during a respective sampling interval of said plurality of sampling intervals being algorithmically related to two earlier said samples of said output signal and to at least one said control signal of said plurality of control signals;

said plurality of control signals including a first control signal, a second control signal, and at least one intermediate control signal, said oscillator means responding to said first control signal to generate said output signal at a first frequency, said oscillator means responding to said second control signal to generate said output signal at a second frequency, said oscillator means responding to said at least one intermediate control signal to generate said output signal at at least one intermediate frequency intermediate said first frequency and said second frequency, each respective intermediate control signal of said at least one intermediate control signal being associated with a respective intermediate frequency.

9. An apparatus for generating an output signal in response to an input signal having a variable input level as recited in claim 8 wherein said algorithmic relation among said output signal, two earlier samples of said output signal, and said at least one control signal comprises:

$$x(n) = \delta x(n-1) - x(n-2),$$

where $x(n)$ = value of said output signal during said current sampling period;

$x(n-1)$ = sample of said output signal one said sampling period past;

$x(n-2)$ = sample of said output signal two said sampling periods past; and $\delta$ = said control signal for said current said sampling period.

* * * * *